United States Patent [19]

Murduck et al.

[11] Patent Number: 4,844,989

[45] Date of Patent: Jul. 4, 1989

[54] SUPERCONDUCTING STRUCTURE WITH LAYERS OF NIOBIUM NITRIDE AND ALUMINUM NITRIDE

[75] Inventors: James M. Murduck, Lisle, Ill.; Yves J. Lepetre, Lauris, France; Ivan K. Schuller, Woodridge; John B. Ketterson, Evanston, both of Ill.

[73] Assignee: The University of Chicago (Arch Development Corp.), Chicago, Ill.

[21] Appl. No.: 27,928

[22] Filed: Mar. 19, 1987

[51] Int. Cl.$^4$ ............................................. B32B 15/04
[52] U.S. Cl. .................................. 428/698; 428/699; 428/700
[58] Field of Search ............... 428/698, 699, 700, 328; 427/99

[56] References Cited

U.S. PATENT DOCUMENTS

| | | | |
|---|---|---|---|
| 3,922,475 | 11/1975 | Manasevit | 428/700 |
| 4,189,516 | 2/1980 | Dryburgh et al. | 428/700 X |
| 4,218,507 | 8/1980 | Deffeyes et al. | 428/328 |
| 4,437,227 | 3/1984 | Flannery et al. | 427/99 X |

Primary Examiner—Nancy A. B. Swisher
Attorney, Agent, or Firm—Michael D. Rechtin

[57] ABSTRACT

A superconducting structure is formed by depositing alternate layers of aluminum nitride and niobium nitride on a substrate. Deposition methods include dc magnetron reactive sputtering, rf magnetron reactive sputtering, thin-film diffusion, chemical vapor deposition, and ion-beam deposition. Structures have been built with layers of niobium nitride and aluminum nitride having thicknesses in a range of 20 to 350 Angstroms. Best results have been achieved with films of niobium nitride deposited to a thickness of approximately 70 Angstroms and aluminum nitride deposited to a thickness of approximately 20 Angstroms. Such films of niobium nitride separated by a single layer of aluminum nitride are useful in forming Josephson junctions. Structures of 30 or more alternating layers of niobium nitride and aluminum nitride are useful when deposited on fixed substrates or flexible strips to form bulk superconductors for carrying electric current. They are also adaptable as voltage-controlled microwave energy sources.

15 Claims, 5 Drawing Sheets

SUPERCONDUCTING STRUCTURE WITH LAYERS OF NIOBIUM NITRIDE AND ALUMINUM NITRIDE

CONTRACTUAL ORIGIN OF THE INVENTION

The United States has rights in this invention pursuant to Contract No. DE-AC02-84GC20057 between the United States Department of Energy and Argonne National Laboratory.

BACKGROUND OF THE INVENTION

This invention relates to a structure formed of alternate thin layers of a superconductor and an insulating semiconductor. In particular, it relates to a structure formed by disposing a plurality of alternate layers of niobium nitride and aluminum nitride that exhibits improved superconducting properties at temperatures near absolute zero.

Superconducting materials in thin films are useful as metal-insulator-metal (MIM) sandwich structures such as Josephson Devices, formed by two layers of superconducting film separated by a thin insulating layer, or as an artificial superlattice (AS), which is a stack of superconducting films separated by insulating layers. Thin films are typically tens or hundreds of Angstroms in thickness. The term "thin" means less than the characteristic penetration depth of a magnetic field into the superconductor. In general, both the parallel critical field and the critical temperature are functions of the thickness of the superconductor, the materials of which it is made, and the uniformity of the crystal structure up to its surface. The parallel critical field is the strength of the magnetic field parallel to the layer at which superconductivity disappears for a given temperature. The critical temperature is the highest temperature at which a material exhibits superconductivity. To make a Josephson junction, it is necessary not only to have a superconducting material, but also to have an insulator that bonds well to the superconductor, that has high resistivity, and that can be deposited uniformly.

The deposition of alternate thin films of superconducting material and insulating material allows the fabrication of an artificial superlattice (AS) that forms a superconductor with enhanced parallel critical fields and high critical currents. Such structures are useful as current carriers for magnets in fusion applications. To optimize these properties, it is desirable also to maintain the crystal structure up to the surface of the superconducting material, with minimum roughness at the interfaces.

SUMMARY OF THE INVENTION

It is an object of the present invention to provide a better superconducting structure.

It is a further object of the present invention to provide a superconducting structure that is an artificial superlattice in the form of alternating thin layers of superconducting material and insulating material.

It is a further object of the present invention to provide a superconducting structure having alternating thin layers of superconducting material and insulating material that are bonded securely together.

It is a further object of the present invention to provide a layered superconducting structure having high parallel critical fields, high critical currents, and high transition temperatures.

It is a further object of the present invention to provide a superconducting structure formed of sputtered material having crystalline structures that provide substantially matched growth sites.

It is a further object of the present invention to provide a structure formed of one or more thin films of niobium nitride that are bonded to one or more thin films of aluminum nitride.

It is a further object of the present invention to provide a superconducting structure that is useful for making Josephson junctions.

Other objects will become apparent in the course of a detailed description of the invention.

A superconducting structure is formed by depositing alternate layers of aluminum nitride and niobium nitride on a substrate. Deposition methods include dc magnetron reactive sputtering, rf magnetron reactive sputtering, thin-film diffusion, chemical vapor deposition, and ion-beam deposition. Structures have been built with layers of niobium nitride and aluminum nitride having thicknesses in a range of 20 to 350 Angstroms. Best results have been achieved with films of niobium nitride deposited to a thickness of approximately 70 Angstroms and aluminum nitride deposited to a thickness of approximately 20 Angstroms. Structures of 30 or more alternating layers of niobium nitride and aluminum nitride are useful when deposited on fixed substrates or flexible strips to form bulk superconductors for carrying electric current. They are also adaptable as voltage-controlled microwave energy sources. Films of niobium nitride separated by a single layer of aluminum nitride from 5 to 200 Angstroms in thickness are useful in forming Josephson junctions.

DETAILED DESCRIPTION OF THE INVENTION

Figure 1:
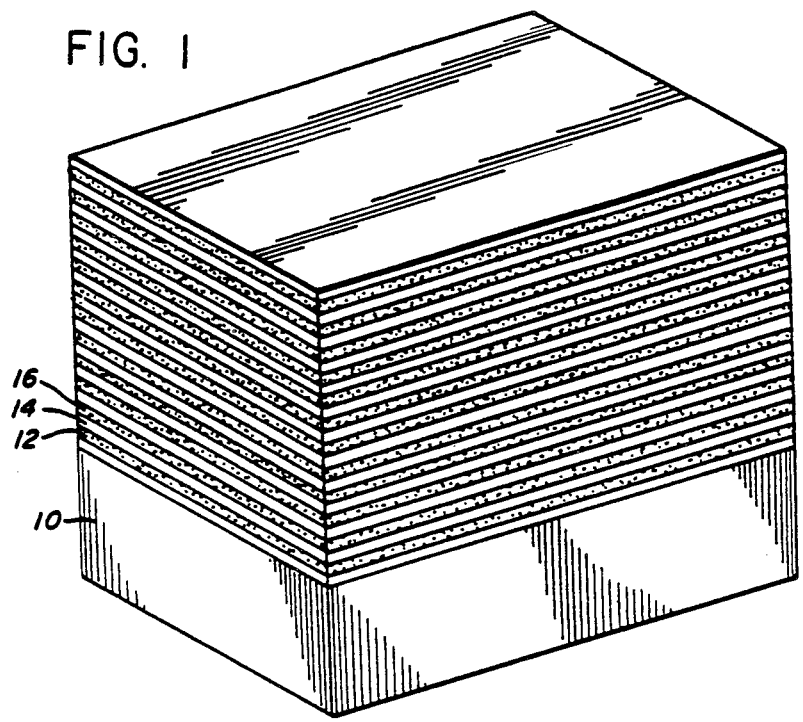
FIG. 1 is a perspective view of a substrate containing a film comprising the structure of the present invention.

FIG. 1 is a perspective view of a substrate containing a film comprising the structure of the present invention. In FIG. 1, substrate 10 has been used to deposit in succession niobium nitride layer 12, aluminum nitride layer 14, and niobium nitride layer 16. The structure of FIG. 1 is a metal-insulator-metal (MIM) sandwich structure of a type that has utility as a Josephson junction. In embodiments of the invention that have been made using MIM structures, substrate 10 has been 90° sapphire. If the structure of the present invention were instead to be used as a superconductor for a magnet or a power distribution system, then substrate 10 would referably be a strip of steel, copper, hastelloy, or the like, that can provide structural support at the necessary temperatures, bond firmly to the structure of the present invention, provide thermal stabilization, and be formed into a desired shape for such an application. It would be desirable to have from 10 to 1000 layers 12 and 14 to increase the total current-carrying capacity while maintaining a constant current density.

Figure 2:
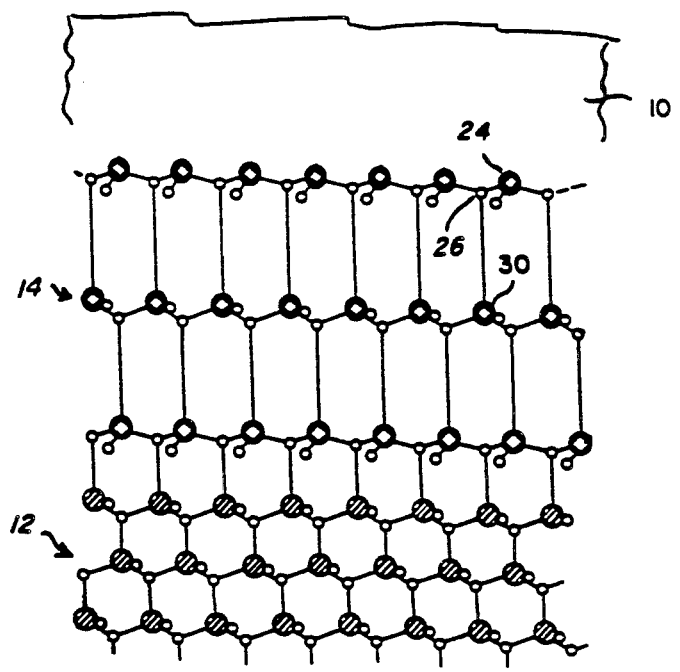
FIG. 2 is a sketch of the crystal structures of niobium nitride and aluminum nitride MIM cross-section.

FIG. 2 is a sketch of the crystal structures of niobium nitride and aluminum nitride MIM cross-section as they are used to form the structure of the present invention. In FIG. 2, substrate 10 is shown at the interface between substrate 10 and layer 22 of aluminum nitride. It is known that aluminum nitride crystallizes in the wurtzite structure. This is an array characterized by a hexagonal arrangement in a plane in which the atoms are alternately aluminum and nitrogen. Stacked above this is a substantially identical hexagon in which aluminum atoms are bonded to nitrogen atoms and vice versa. The characteristic spacing of atoms in the crystal of aluminum nitride along the (0001) or basal orientation perpendicular to the substrate is approximately five angstroms. Thus, aluminum atoms 24 are approximately five angstroms above substrate 20, approximately five angstroms from nitrogen atoms 26, and five angstroms from nitrogen atoms 28. These in turn are approximately five angstroms from aluminum atoms 30 that are in the second hexagonal layer. The number of hexagons is a function of the thickness of the deposited layer of aluminum nitride. The results plotted here have been achieved with aluminum nitride layers of approximately 20 Angstroms in thickness which means that the number of such hexagons in the deposited aluminum nitride is approximately four high. The crystal arrangement is referred to as (0001), which describes hexagons of alternating nitrogen and aluminum atoms that are in columns essentially perpendicular to the substrate 20.

Niobium nitride crystallizes in a rock-salt structure, which has alternately an atom of niobium and an atom of nitrogen at all of the corners of a cube. The cube is disposed so that the main diagonal, which extends from a nitrogen atom to a niobium atom, is perpendicular to the plane of the hexagons of the aluminum nitride crystals and to the substrate 20. This is referred to as the (111) orientation. The in-plane structures of both aluminum nitride and niobium nitride in their orientations as described above are hexagonal with a lattice mismatch of only 0.27 percent. The in-plane atomic spacing of aluminum nitride and niobium nitride is substantially equal, which may aid in forming the strong bond between the two, and also aids in maintaining the uniformity of the crystal structure of the (111) niobium nitride at the interface. This is suggested in FIG. 2 in which niobium atoms 32 and nitrogen atoms 34 are shown in profile. In the various reductions to practice of the present invention, niobium nitride layers were produced in thicknesses ranging from about 20 to about 350 Angstroms. The best results in terms of enhanced parallel critical fields were achieved at a thickness of the order of 70 Angstroms of niobium nitride. The separation of layers in (111) niobium nitride is of the order of 2.5 Angstroms, so this result was achieved with approximately 30 (111) crystalline layers of niobium nitride.

As stated above, it is possible to deposit aluminum nitride and niobium nitride on a substrate in a number of ways, including sputtering, chemical deposition, ion-beam deposition, and others. The results reported here were obtained by using a method similar to that taught in U.S. Pat. No. 4,448,854, entitled "Coherent Multilayer Crystals and Method of Making," which is assigned to the assignee of the present invention, and which is incorporated here by reference as if set forth fully. This patent teaches a method of sputtering alternate layers of different compounds. The samples of the structure of the present invention were produced by using the method taught by this patent to sputter first aluminum, then niobium, in an atmosphere of argon and nitrogen. Nitrogen is believed to react to form the nitride at the substrate surface.

Figure 3:
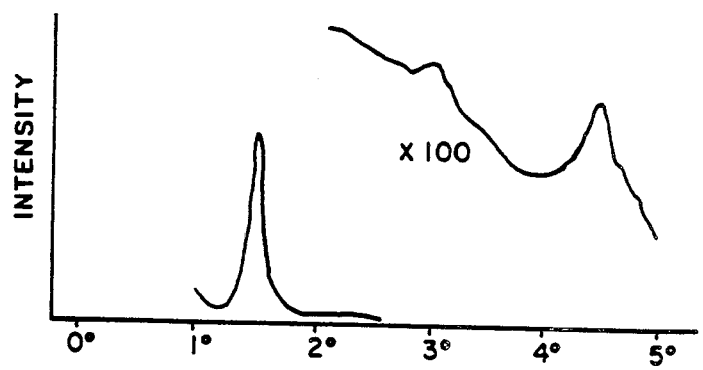
FIG. 3 is a plot of small-angle x-ray diffraction by the structure of the present invention.

FIG. 3 is a plot of the x-ray intensity observed as a function of the angle of incidence of an x-ray beam on a multi-layer sample of the structure of the present invention. FIG. 3 shows small-angle scattering with a full-width half-maximum value of 0.14° at 1.5°, indicating that the method of deposition has produced alternate layers of the two materials.

Figure 4:
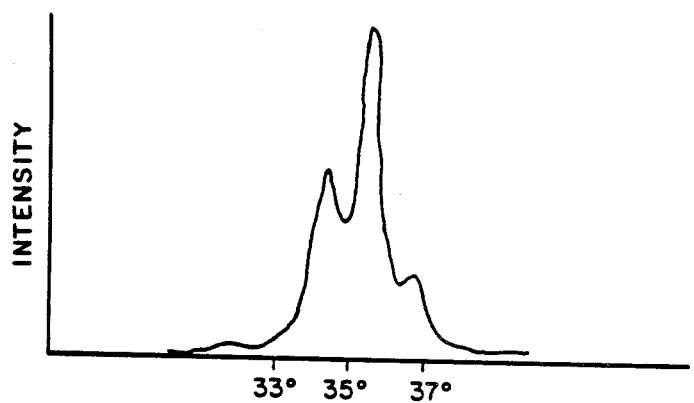
FIG. 4 is a plot of high-angle x-ray diffraction by the structure of the present invention.

FIG. 4 is a plot of the x-ray intensity as a function of angle for large-angle x-ray diffraction from the structure that was used to obtain the data in FIG. 2. Taken together, FIGS. 3 and 4 verify the existence of the modulation structure in the samples that were measured.

Figure 5:
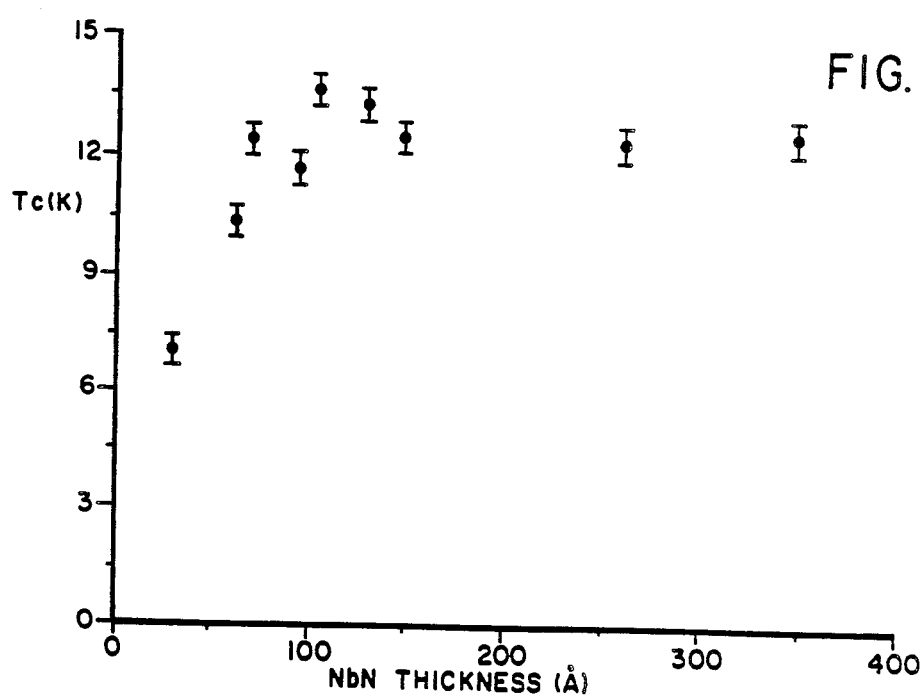
FIG. 5 is a plot of critical temperature as a function of the thickness of a layer of niobium nitride with a constant separating layer of 20 Angstroms of aluminum nitride.

FIG. 5 is a plot of the critical temperature as a function of the thickness of niobium nitride. It can be seen that, starting at a thickness of about 50 Angstroms, the critical temperature is of the order of 12 K up to a thickness of about 350 Angstroms. The critical temperature decreases at a niobium nitride thickness of about 50 Angstroms.

Figure 6:
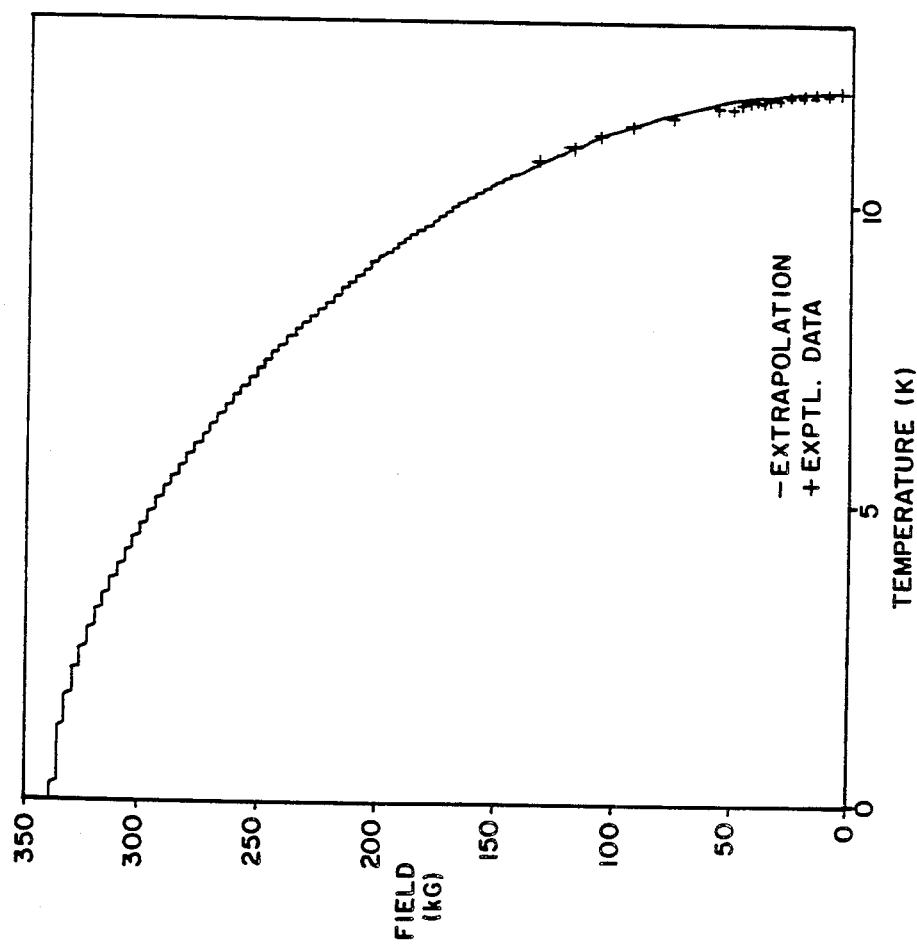
FIG. 6 is a plot of the critical temperature as a function of the applied parallel magnetic field for AS of niobium nitride and aluminum nitride.

FIG. 6 is a plot of the applied magnetic field in kilogauss versus the critical temperature in K. The critical temperature for zero applied magnetic field is seen to be approximately 11.90 K, and the slope of the curve at the critical temperature was determined to be approximately 26.24 kilogauss per K.

Figure 7:
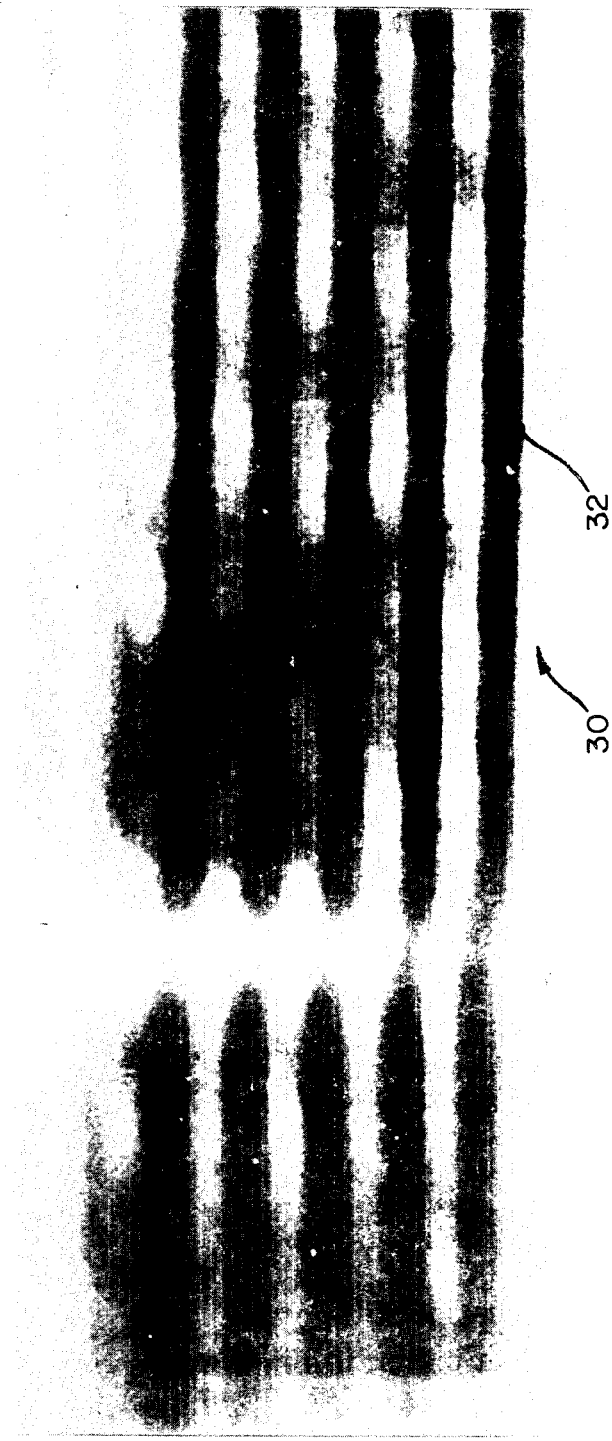
FIG. 7 is a transmission electron micrograph of a section of an AS of the present invention.

FIG. 7 is a transmission electron micrograph of a multilayer. In FIG. 7, layers 30 were aluminum nitride, deposited by dc magnetron reactive sputtering to a thickness of about 102 Angstroms. Layers 32 were niobium nitride, similarly deposited to a thickness of about 40 Angstroms.

Figure 8:
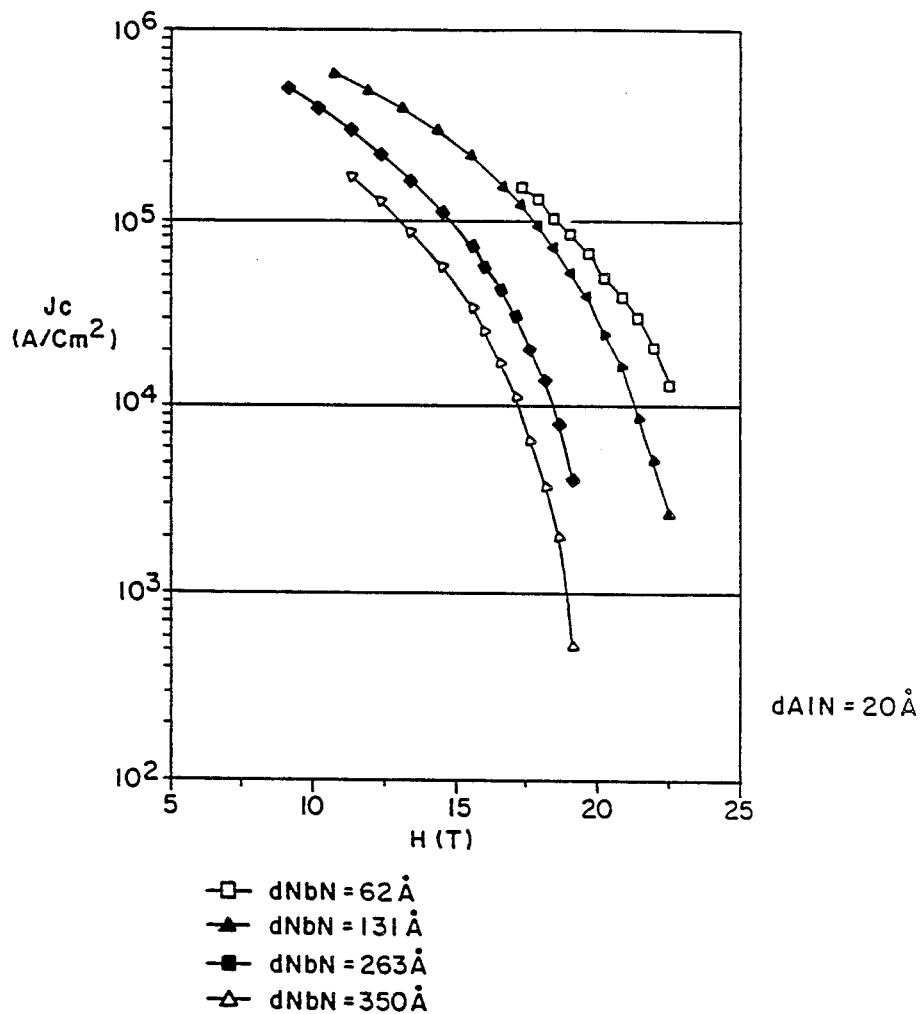
FIG. 8 is a plot of critical current as a function of applied magnetic field of an AS with varied niobium nitride layer thicknesses and a constant aluminum nitride thickness of 20 Angstroms.

FIG. 8 is a plot of critical current as a function of applied magnetic field for AS structures containing 30 layers of niobium nitride, from 62 to 350 Angstroms thick, separated by layers of aluminum nitride that are 20 Angstroms thick. It can be seen from FIG. 8 that the AS structure at reduced temperatures is capable of carrying currents that produce substantial magnetic fields without being forced from the superconducting state.

Niobium nitride is of interest as a material for superconducting magnets in future applications involving controlled thermonuclear fusion because it is known to be resistant both to radiation and to strain. The NbN-AlN structures shown here were produced by dc magnetron reactive sputtering in partial pressures of 6 mTorr of argon and 3 mTorr of nitrogen. Substrate temperatures were approximately 300° C., and gun deposition rates were of the order of 15 Angstroms per second of niobium nitride and 6 Angstroms per second of aluminum nitride. The base pressure of the vacuum system was of the order of 0.1 to 0.2 microtorr. Crystallographic investigation showed that as the thickness of niobium nitride increased, the percentage of niobium nitride in a (100) orientation increased and that in a (111) orientation decreased. This suggested that the effect of the crystal structure of the aluminum nitride was to begin crystal growth of niobium nitride at the interface in the (111) orientation. The crystal structure of niobium nitride appears to be predominantly (111) at a thickness of 70 Angstroms.

The utility of the structure of the present invention in the construction of Josephson devices is enhanced by material that meets certain requirements. The higher the transition temperature, the more desirable the material is for use as a Josephson junction. The structure of the present has produced transition temperatures as high as 15 K. A Josephson junction requires an insulating barrier which is structurally stable and able to withstand thermocycling from room temperature to the temperature of liquid helium. Aluminum nitride, ranging from 5 to 200 Angstroms in thickness, represents such material, and it is firmly bonded to the superconductor structure of the present invention. In a Josephson junction, the niobium nitride is preferably greater than 20 Angstroms in thickness, and there is no upper limit to the thickness as long as the integrity of the crystal lattice is maintained. When used as a multi-layer superconducting device (a superlattice structure), the structure of the present invention has possible applications as a microwave power source and as a superconductor material for winding superconducting magnets.

The description given here is intended to serve as an example of the best mode known to the inventors of practicing the invention. It is intended to be illustrative of the invention, and not to be a limit of the scope of the invention. The scope of the invention should be limited only by the appended claims.

The embodiments of this invention in which an exclusive property or privilege is claimed are defined as follows:

1. A multi-layered structure adapted for operating as a superconductor at high critical current densities comprising, alternating layers of niobium nitride and aluminum nitride having thicknesses of the order of 20 to 200 Angstroms, and the number of layers of each being in the range of 10 to 1000.

2. The structure of claim 1 comprising in addition a substrate upon which the multi-layered structure is disposed.

3. The structure of claim 1 wherein the aluminum nitride is deposited in the (0001) wurtzite crystal structure and wherein the niobium nitride is disposed in the sodium chloride cubical crystal structure in a (111) orientation.

4. The structure of claim 3 wherein the layers of aluminum nitride are each of the order 20 Angstroms in thickness, and wherein the layers of niobium nitride are each of the order of 70 Angstroms in thickness.

5. The structure of claim 3 comprising in addition a substrate upon which the multi-layered structure is disposed.

6. The structure of claim 5 wherein the substrate is sapphire.

7. The structure of claim 5 wherein the substrate is made of a metal selected from the group consisting of copper, steel, or hastelloy.

8. A three-layered superconductor structure having an enhanced critical temperature comprising, a layer of niobium nitride deposited on a substrate, a second layer of aluminum nitride deposited on the first layer, and a third layer of niobium nitride deposited on the second layer, the three-layered structure forming a Josephson junction when cooled to temperatures at which the niobium nitride is a superconductor.

9. The structure of claim 8 wherein the aluminum nitride is between 5 and 200 Angstroms in thickness and wherein the niobium nitride is greater than 20 Angstroms in thickness.

10. A multi-layered structure adapted for operating as a superconductor at high critical current densities comprising, alternating thin layers of niobium nitride and aluminum nitride.

11. The multi-layered structure as defined in claim 10 wherein said alternating thin layers comprise layer thicknesses of the order of about 20–350 Angstroms.

12. A multi-layered structure adapted for operating as a superconductor at high critical current densities comprising, alternating thin layers of niobium nitride and an insulating material structurally compatible with said niobium nitride layer, thereby securely bonding said niobium nitride layer to said insulating material layer.

13. A superconductor having a multi-layered structure comprising, alternating thin layers of niobium nitride and aluminum nitride, the number of said alternating layers being in excess of 10, said superconductor adapted to function with at least one of high critical current density and enhanced parallel critical fields.

14. A voltage controlled microwave energy source comprising, a superconductor having a multi-layered structure including alternating thin layers of niobium nitride and aluminum nitride.

15. A multi-layered structure adapted for operating as a superconductor with enhanced parallel critical fields, comprising alternating thin layers of niobium nitride and aluminum nitride.

* * * * *